United States Patent
Kuo

[11] Patent Number: 6,102,734
[45] Date of Patent: Aug. 15, 2000

[54] ELECTRICAL CONNECTOR

[75] Inventor: Peter Kuo, Chung-Ho, Taiwan

[73] Assignee: Hon Hai Precision Ind. Co., Ltd., Taipei Hsien, Taiwan

[21] Appl. No.: 09/354,683

[22] Filed: Jul. 15, 1999

[30] Foreign Application Priority Data

Dec. 24, 1998 [TW] Taiwan ................................ 87221552

[51] Int. Cl.⁷ ........................................... H01R 13/74
[52] U.S. Cl. ............................................. 439/545
[58] Field of Search ................................ 439/545, 557, 439/676, 553

[56] References Cited

U.S. PATENT DOCUMENTS

| | | | |
|---|---|---|---|
| 3,355,702 | 11/1967 | Mndschenk et al. | 439/545 |
| 4,647,129 | 3/1987 | Kandybowski et al. | 439/545 |
| 5,127,852 | 7/1992 | Cravens et al. | 439/545 |
| 5,795,185 | 8/1998 | Edgley et al. | 439/545 |

*Primary Examiner*—Gary F. Paumen
*Attorney, Agent, or Firm*—Wei Te Chung

[57] ABSTRACT

An electrical connector includes a casing retaining a number of contact elements therein and defining a front opening adapted to receive a mating connector therein for electrically engaging with the contact elements. The casing defines a pair of outside slots on outside faces of opposite side walls thereof for being received in an opening defined in a circuit board with edges of the opening slidably received in the outside slots of the casing thereby retaining the connector on the circuit board. The contact elements are connected to the circuit board.

6 Claims, 4 Drawing Sheets

ELECTRICAL CONNECTOR

BACKGROUND OF THE INVENTION

1. Field of the Invention

The present invention generally relates to an electrical connector, and in particular to an electrical connection that can be readily and effectively mounted to a circuit board.

2. The Prior Art

An electrical connector is temporarily retained on a circuit board by means of positioning pins integrally formed with an insulative casing thereof or by means of board locks integrally formed with a shielding member thereof. The connector is permanently fixed to the circuit board by soldering contact elements thereof to the circuit board. The soldering process is a high temperature process which causes damage to the positioning pins and thus decreases the mounting stability of the connector on the circuit board. The board lock, although being made of metal and thus having no such stability problems, causes damage to the circuit board when forcibly inserted through holes defined in the circuit board.

Thus, it is desirable to have an electrical connector which can be readily and effectively mounted to a circuit board without damaging the circuit board or sustaining damage to itself.

SUMMARY OF THE INVENTION

Accordingly, an object of the present invention is to provide an electrical connector that can be readily and effectively mounted to a circuit board without damaging the circuit board or sustaining damage to itself.

To achieve the above object, an electrical connector in accordance with the present invention comprises a casing retaining a number of contact elements therein and defining a front opening adapted to receive a mating connector therein for electrically engaging with the contact elements. The casing defines a pair of outside slots on outside faces of opposite side walls thereof for being received in an opening defined in a circuit board with edges of the opening slidably received in the outside slots of the casing thereby retaining the connector on the circuit board. The contact elements are connected to the circuit board.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
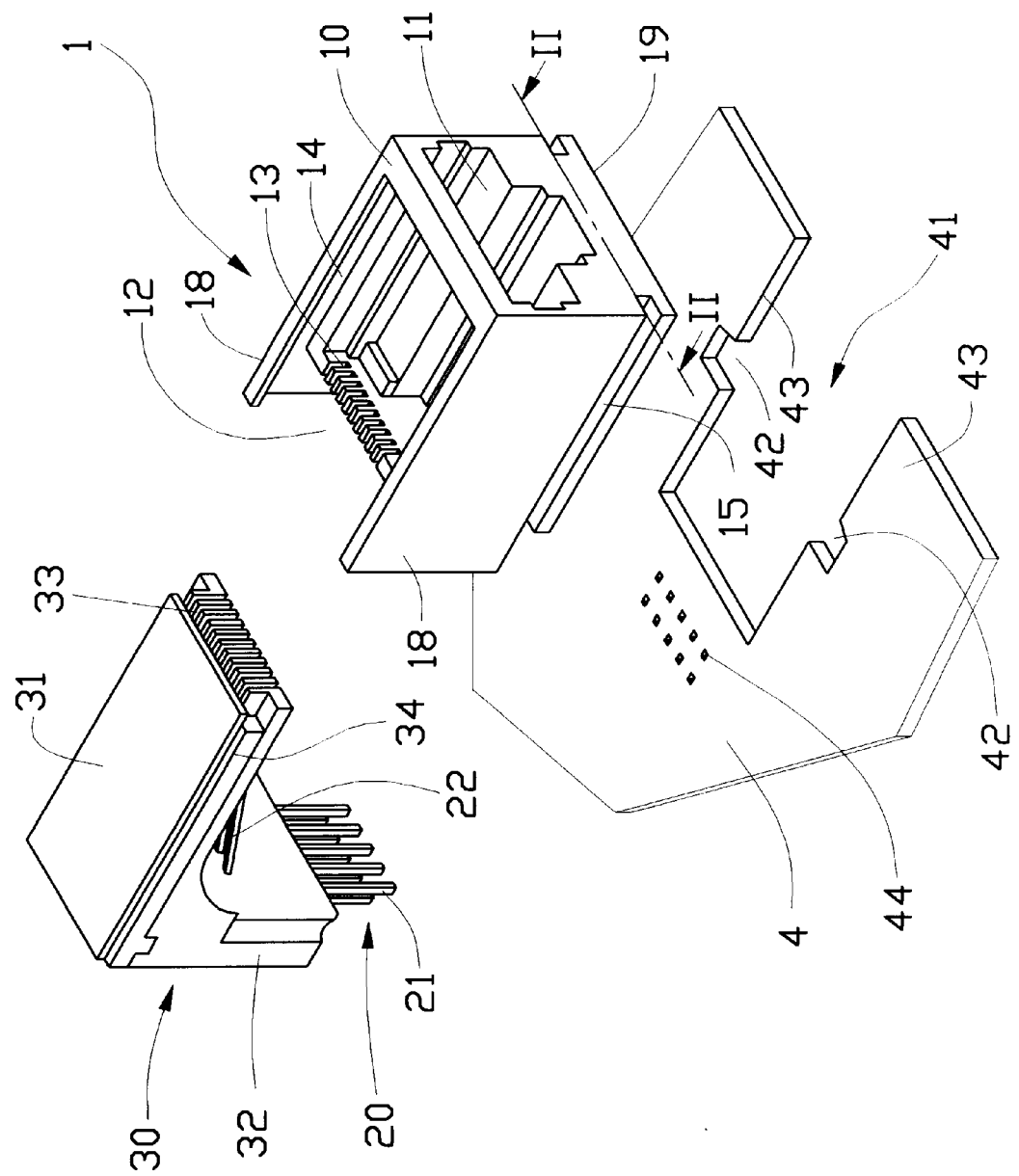
FIG. 1 is an exploded view of an electrical connector of the present invention to be mounted to a circuit board.

Referring to the drawings and in particular to FIG. 1, an electrical connector 1 in accordance with the present invention comprises an insulative casing 10 and a plurality of contact elements 20 which are fixed in an insulative retainer 30 received in the casing 10. The casing 10 comprises two side walls 18 connected by a bottom wall 19 for defining an interior space (not labeled) therebetween for receiving the contact retainer 30 and the contact elements 20. The casing 10 defines a front opening 11 through which a mating connector (not shown) is inserted into the interior space for electrically engaging with the contact elements 20.

Figure 3:
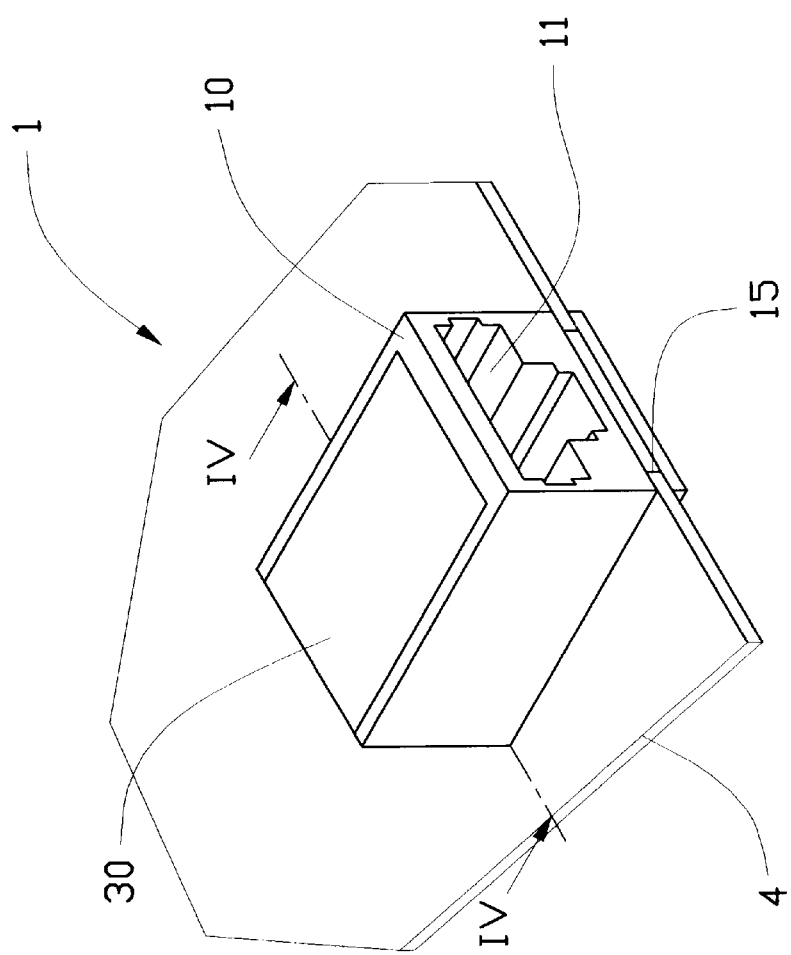
FIG. 3 is a perspective view of the electrical connector mounted on a circuit board.

Two outside slots 15 are defined in outside faces of the side walls 18 proximate the bottom wall 19 for being fit into an opening 41 defined in a circuit board 4. The opening 41 extends from an outermost edge of the circuit board 4, and defines an assembling direction along which the connector 1 is moved with regard to the circuit board 4, and a lateral direction perpendicular to the assembling direction. The outside slots 15 receive opposite edges 43 of the opening 41 therein thereby retaining the connector 1 on the circuit board 4 as shown in FIGS. 3 and 4.

Figure 2:
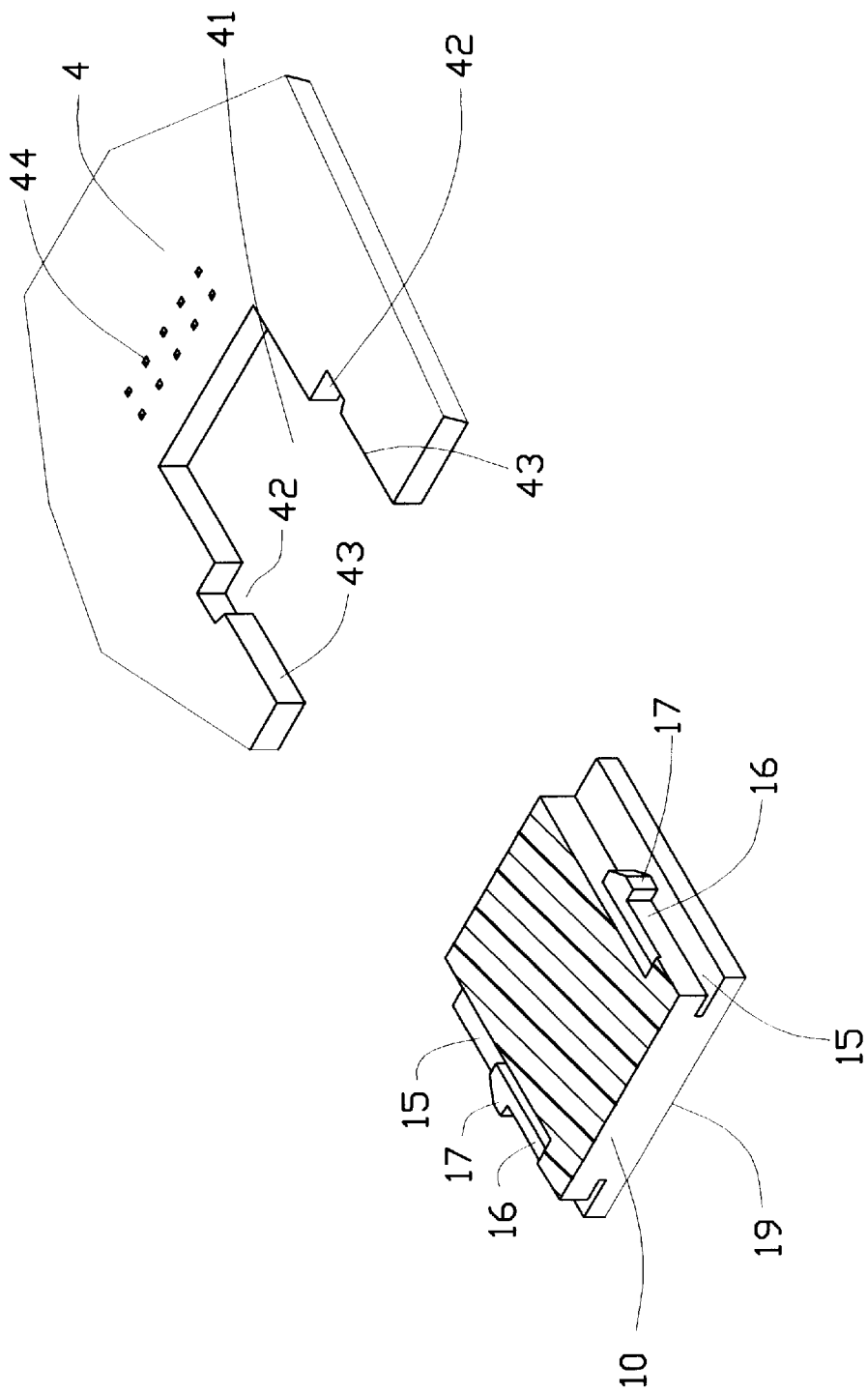
FIG. 2 is a perspective view of the electrical connector with a portion thereof taken away along line II—-II of FIG. 1 and a circuit board to which the connector is to be mounted.
Figure 4:
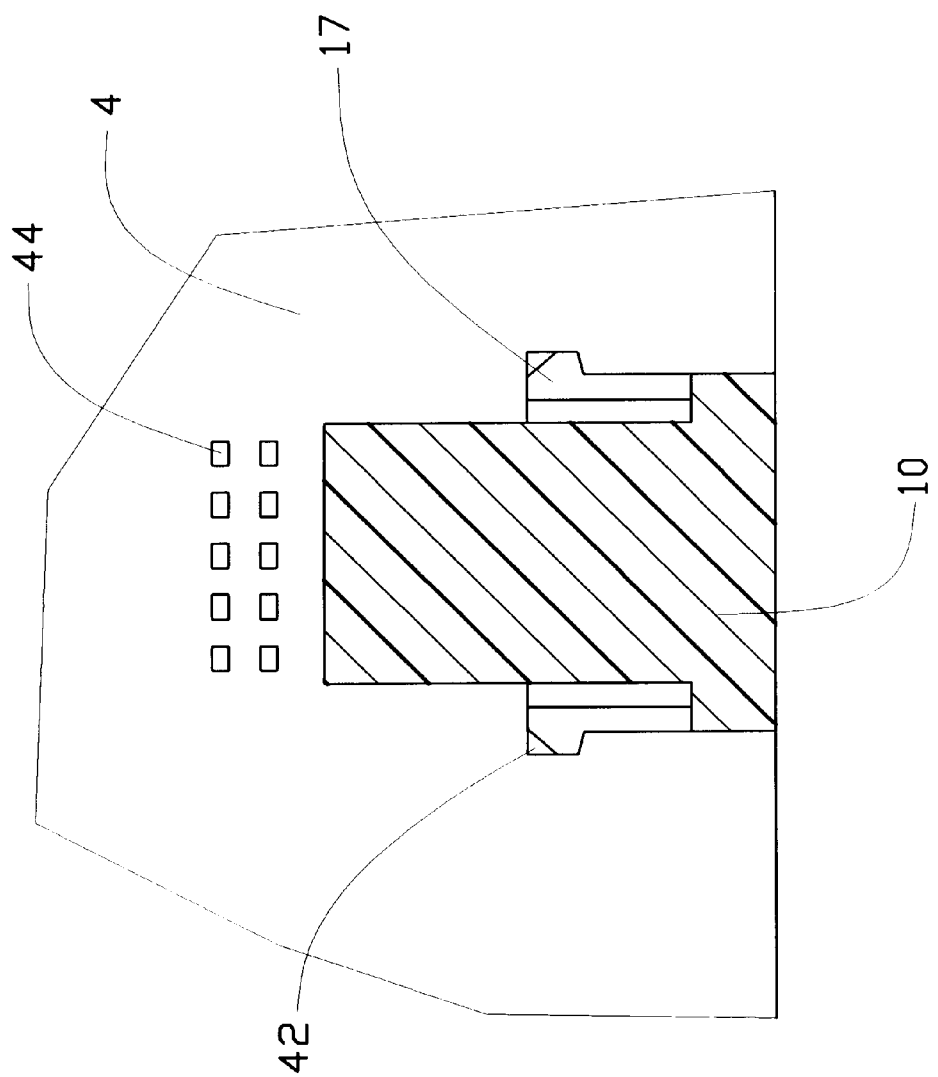
FIG. 4 is a cross-sectional view taken along line IV—IV of FIG. 3.

As shown in FIGS. 2 and 4, a resilient arm 16 is formed in each of the slots 15 and has a barb 17 engaging with a notch 42 defined in the corresponding edge 43 of the opening 41 for securing the connector 1 in the opening 41.

The contact retainer 30 comprises a horizontal section 31 and a vertical section 32 and is received in the interior space of the casing 10 for closing a top side and a rear side thereof. The horizontal section 31 forms two side flanges 34 slidably received in inside slots 14 defined in inside faces of the side walls 18 for securing the contact retainer 30 in the casing 10.

The contact elements 20 are fixed in the vertical section 32 of the contact retainer 30 and extend into grooves 33 defined in the horizontal section 31 and are in communication with the interior space of the casing 10 for engaging with the mating connector. Each contact element 20 comprises an engaging section 22 extending beyond the groove 33 and into the interior space of the casing 10 for effectively engaging with the mating connector. The engaging section 22 has a free end received in a notch 13 defined in the casing 10 for being floatingly retained therein. Each contact element 20 comprises a mounting section 21 extending beyond the contact retainer 20 and received in holes 44 defined in the circuit board 4 for being soldered thereto.

The contact retainer 30 may be fixed to the circuit board 4 by soldering the mounting sections 21 of the contact elements 20 to the circuit board 4 thereby rendering the horizontal section 31 thereof substantially parallel to the circuit board 4. The casing 10 is inserted into the opening 41 of the circuit board 4 with the edges 43 of the opening 41 slidably received in the outside slots 15 of the casing 10 and the side flanges 34 of the contact retainer 30 slidably received in the inside slots 14 of the casing 10.

If desired, the mounting sections 21 of the contact elements 20 may be formed parallel to the circuit board 4 thereby rendering them surface-mountable to the circuit board 4.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electrical connector mounted on a circuit board, the electrical connector comprising a casing retaining contact elements therein and defining a front opening adapted to receive a mating connector for electrically engaging with the contact elements, the casing defining a pair of outside slots on outside faces of opposite side walls thereof, the circuit board defining an opening for receiving the electrical connector with opposite edges of the opening of the circuit board slidably received in a direction parallel to the plane of the circuit board in the outside slots of the connector thereby retaining the connector on the circuit board, the contact elements being electrically connected to the circuit board wherein a resilient arm is formed in each of the outside slots of the casing and each arm forms a barb engaging a notch defined in the corresponding edge of the opening of the circuit board for securing the connector in the opening.

2. The electrical connector and circuit board as claimed in claim 1 further comprising a contact retainer retaining the contact elements therein and being received in the casing.

3. The electrical connector and circuit board as claimed in claim 2, wherein the contact retainer comprises a horizontal section and a vertical section, the contact elements being fixed in the vertical section and extending into grooves defined in the horizontal section for being engageable by the mating connector, the horizontal section having side flanges slidably received in inside slots defined in inside faces of opposite side walls of the casing.

4. The electrical connector and circuit board as claimed in claim 3, wherein the contact elements have mounting sections extending beyond the vertical section for being received and fixed in holes defined in the circuit board.

5. The electrical connector and circuit board as claimed in claim 1, wherein the contact elements comprise mounting sections extending beyond the casing for being surface-mounted to the circuit board.

6. An electrical connector assembly comprising:

a connector and a circuit board on which the connector is mounted;

said circuit board defining an opening inward extending from an outermost edge of the circuit board, at least a notch being formed in an inner edge of the opening in a lateral direction; and said connector including a slot having a resilient arm therein with at least a barb on the arm; wherein
when assembled, the connector is moved with regard to the circuit board in an assembling direction parallel to the plane of the circuit board, and said resilient arm is moved in the opening along said inner edge until the barb is latchably engaged within the notch, so that the connector can be horizontally secured to the circuit board with the inner edge of the opening being received in the slot.

* * * * *